(12) United States Patent
Brunnbauer et al.

(10) Patent No.: US 11,314,282 B2
(45) Date of Patent: Apr. 26, 2022

(54) PORTABLE INTERFACE SYSTEM

(71) Applicant: WORKAROUND GMBH, Munich (DE)

(72) Inventors: Konstantin Brunnbauer, Munich (DE); Michael Kettner, Munich (DE)

(73) Assignee: WORKAROUND GMBH, Munich (DE)

( * ) Notice: Subject to any disclaimer, the term of this patent is extended or adjusted under 35 U.S.C. 154(b) by 0 days.

(21) Appl. No.: 16/793,038

(22) Filed: Feb. 18, 2020

(65) Prior Publication Data

US 2020/0264662 A1 Aug. 20, 2020

(30) Foreign Application Priority Data

Feb. 18, 2019 (DE) .................... 10 2019 104 039.6

(51) Int. Cl.
*G06F 1/16* (2006.01)
*H05K 5/00* (2006.01)
*H05K 5/02* (2006.01)
*H05K 7/14* (2006.01)

(52) U.S. Cl.
CPC ......... *G06F 1/1632* (2013.01); *H05K 5/0086* (2013.01); *H05K 5/0286* (2013.01); *H05K 7/1454* (2013.01)

(58) Field of Classification Search
None
See application file for complete search history.

(56) References Cited

U.S. PATENT DOCUMENTS

| | | | |
|---|---|---|---|
| 4,491,791 A | 1/1985 | Balch et al. | |
| 2003/0100340 A1* | 5/2003 | Cupps | H04M 1/72403 455/556.1 |
| 2008/0043416 A1* | 2/2008 | Narayan | G06F 1/169 361/679.03 |
| 2010/0321871 A1* | 12/2010 | Diebel | H04M 1/0262 361/679.01 |
| 2011/0096512 A1 | 4/2011 | Klicpera et al. | |
| 2014/0075075 A1* | 3/2014 | Morrill | H04M 1/72415 710/303 |
| 2016/0350058 A1* | 12/2016 | Zhu | H04N 21/4436 |
| 2017/0179726 A1* | 6/2017 | Garrity | H02J 7/0045 |
| 2018/0054695 A1* | 2/2018 | Castor | H04W 4/80 |

* cited by examiner

*Primary Examiner* — Xanthia C Cunningham
(74) *Attorney, Agent, or Firm* — Dilworth IP, LLC

(57) ABSTRACT

A portable interface system comprising an interface device and a portable base part, wherein the interface device is fixable detachably without tools in an attachment area of the base part and wherein the interface system is designed in such a way that the interface device is activated if the interface device is detached from the base part.

19 Claims, 6 Drawing Sheets

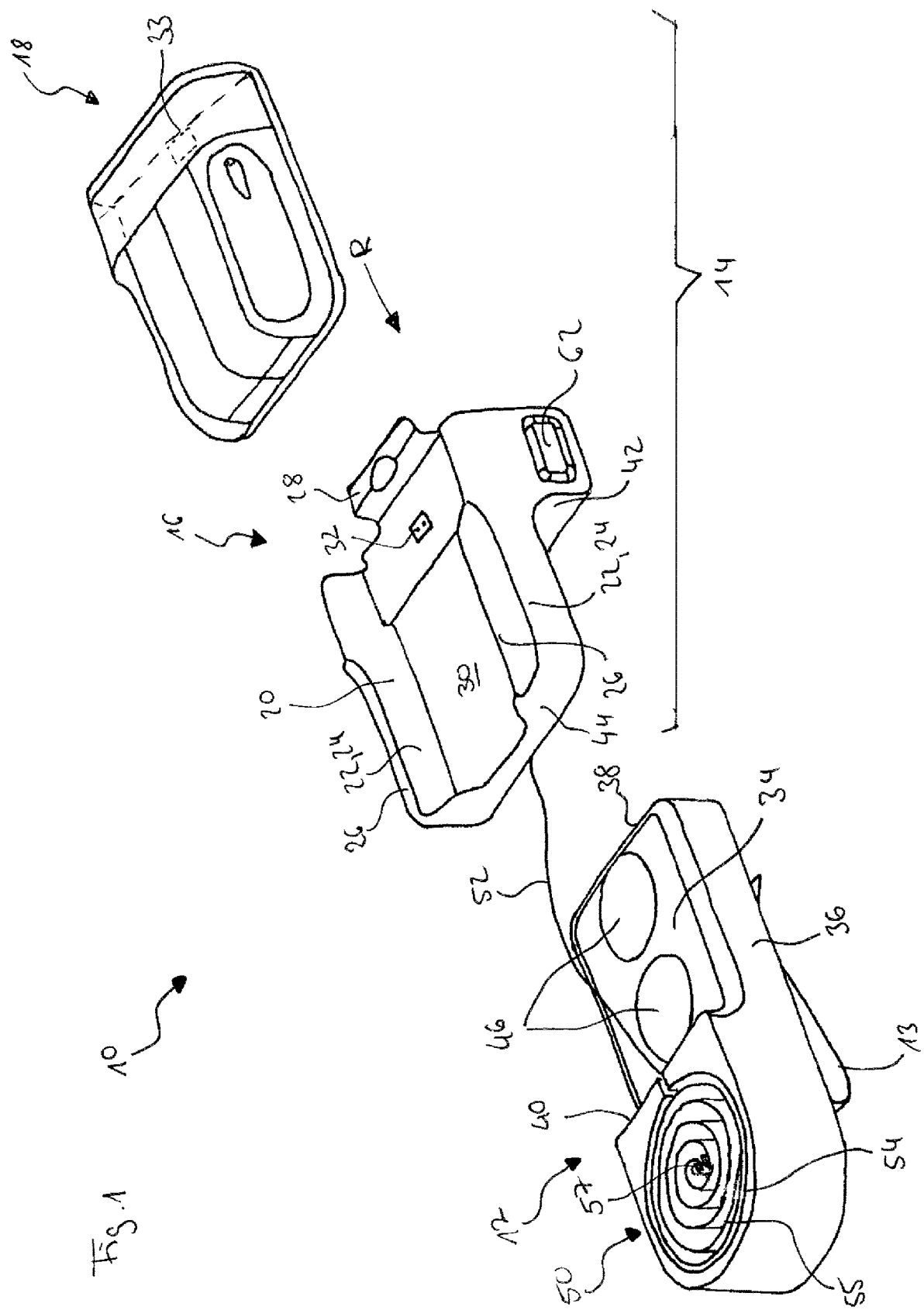

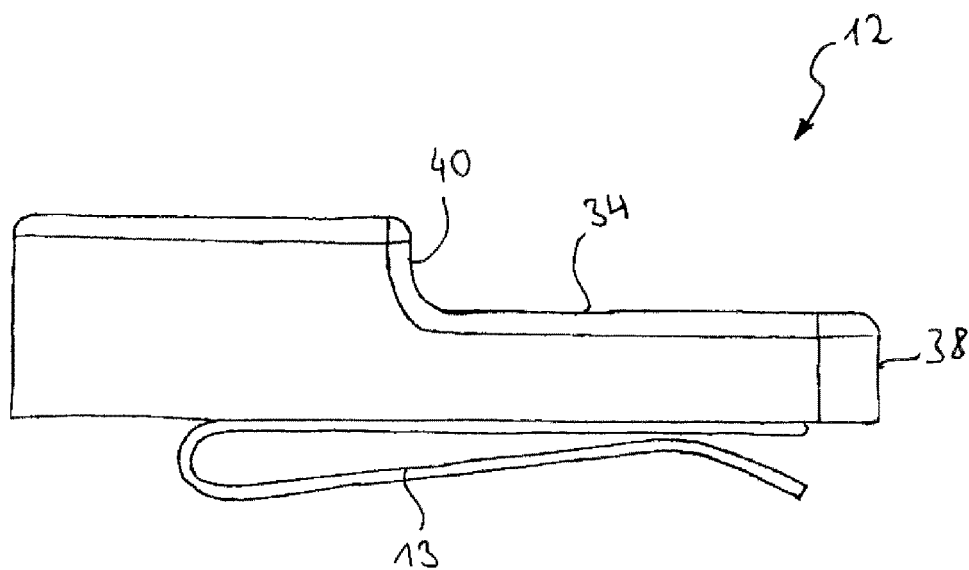
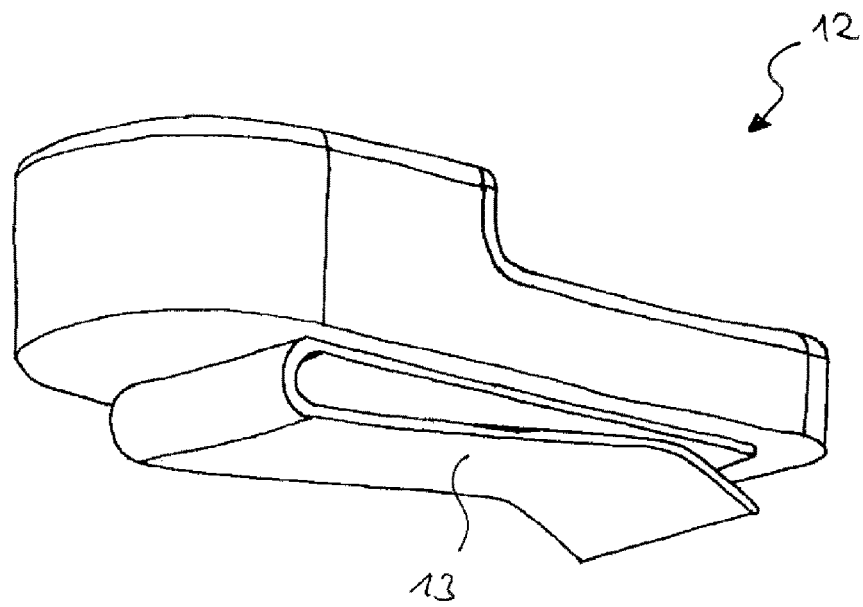

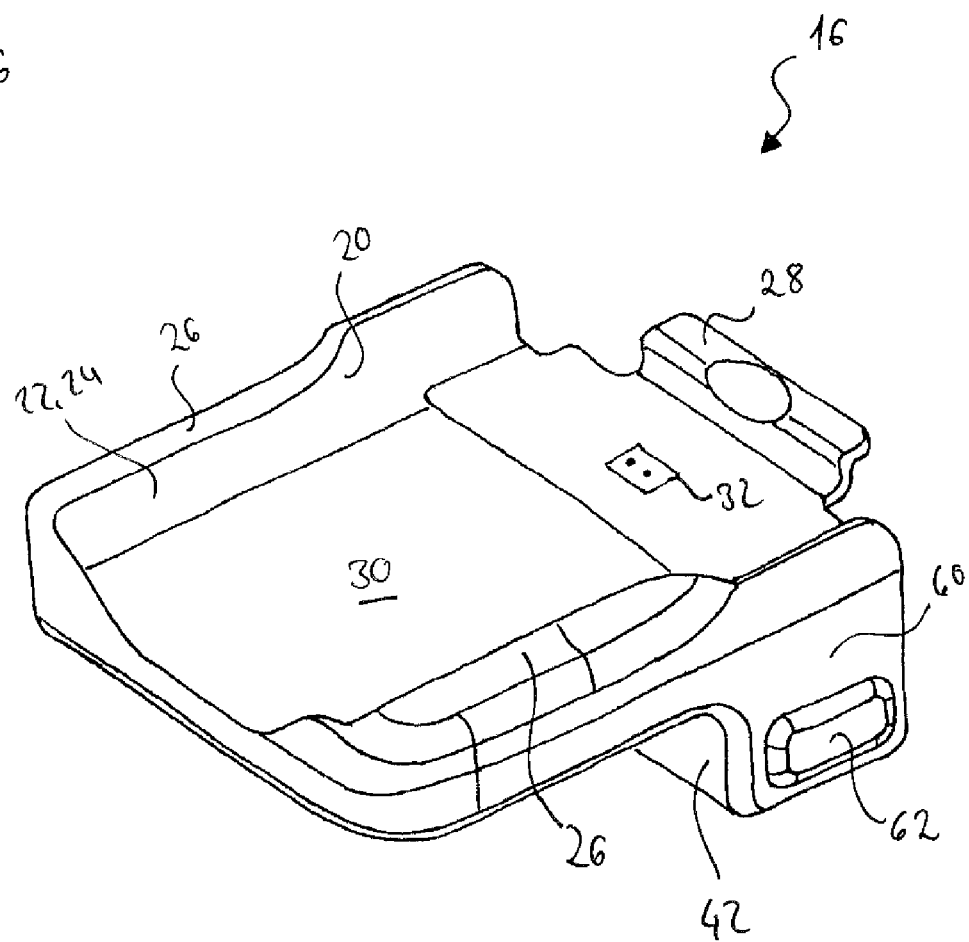

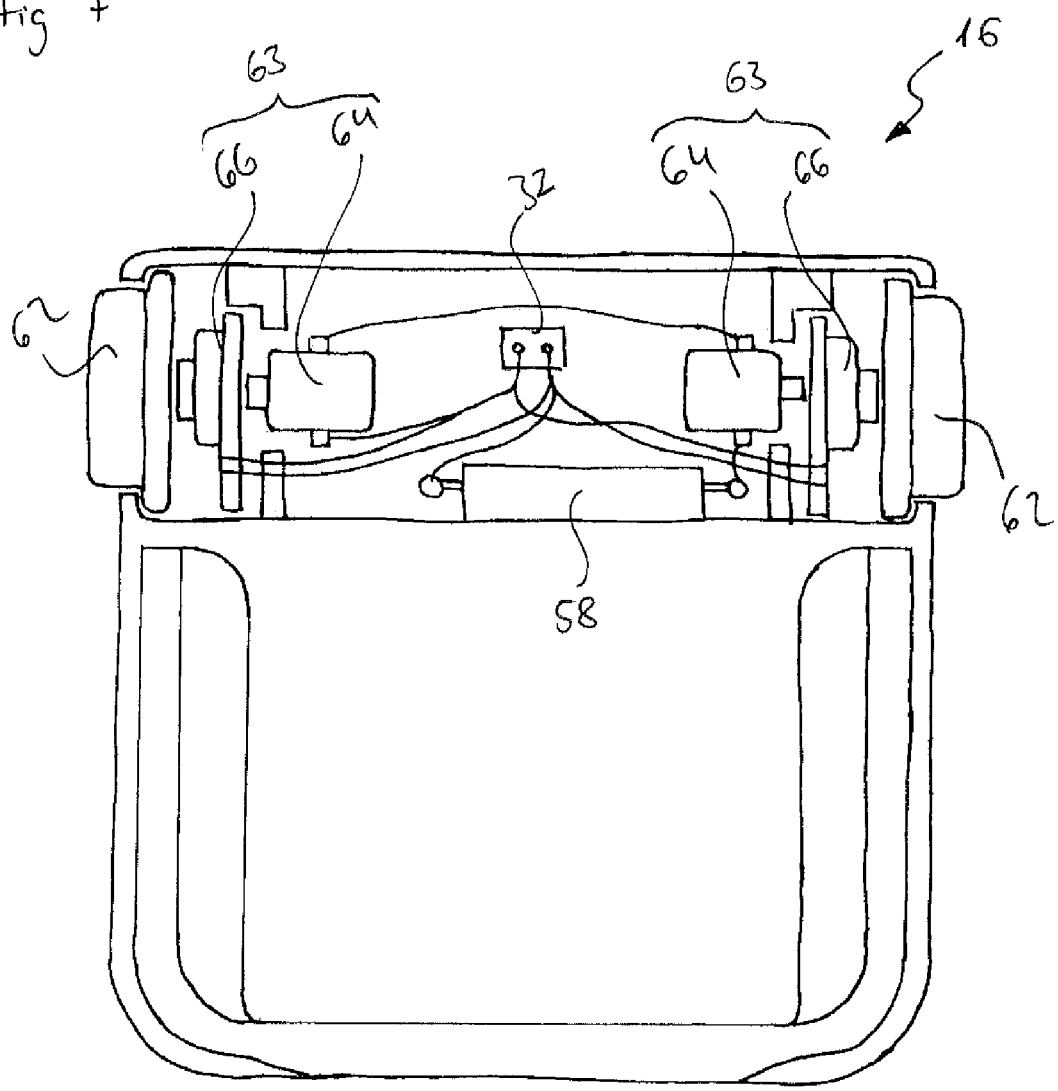

PORTABLE INTERFACE SYSTEM

FIELD OF THE DISCLOSURE

The disclosure relates to portable interface system.

BACKGROUND

Portable interface systems are used to read, display, forward and/or store data. In production processes, interface systems are used, for example, for reading information about used components or for transferring information to a database for storage. In this way, it is possible to establish which components have been built in a specific product. However, interface systems are also used in logistics centers, in particular to read information about a product and to control processes by means of a barcode.

In the known systems, the user must start a data capture process by actuating a trigger. To make a process particularly efficient in terms of time, it is desirable that a data capture process is executed as simply as possible, preferably without a user needing to become active.

SUMMARY

There is a need to provide an interface system which enables a process to be implemented particularly efficiently in terms of time.

For this purpose, a portable interface system is provided comprising an interface device, in particular a sensor device, and a portable base part, wherein the interface device is fixable detachably without tools in an attachment area of the base part and wherein the interface system is designed in such a way that the interface device is activated if the interface device is detached from the base part.

This means that merely by detaching the interface device from the base part, the interface device is put into an operating state, in which the interface device can execute, for example, a data capture process. Thus, all a user must do to start a data capture process is move the interface device to the object from which data is to be captured.

The interface device comprises, for example, an electronic module and a holder, wherein the holder has a retainer that is provided for receiving the electronic module. In this regard, the retainer is particularly suitable for attaching the electronic module repeatably without using tools. Electronic modules are normally expensive to purchase. By designing the electronic module separately, the electronic module can be reused if parts of the interface system need to be replaced due to wear. Furthermore, the electronic module can be used in various identical or similar interface systems equally. This means, if an interface system is not in use at times, the electronic module can be used in another interface system. In this way, investment costs can be kept low.

According to an embodiment, the holder comprises at least one switch and one mating contact, which is connected to the switch electrically, and the electronic module comprises at least one contact element, wherein said at least one mating contact and said at least one contact element are electrically contacted if electronic module is inserted into the retainer of the holder. In particular, the mating contact is also located in the retainer. The electronic module is therefore ready to function as soon as it is inserted into the retainer without needing to establish a contact manually. This is advantageous if the intention is to use the electronic module in various interface devices as interchanging the electronic module is particularly easy.

In particular, the electronic module does not have a switch that is operable externally.

The interface device, in particular the holder, comprises a circuit for activating the interface device with at least one switch. The switch is preferably connected to the mating contact electrically. As a result, the electronic module can be activated by means of the switch in the circuit if the electronic module is located in the holder.

Said at least one switch is actuated if the interface device is fixed on the base part and is not actuated if the interface device is detached from the base part, wherein the interface device is activated if the switch is not actuated. If the switch is actuated, the circuit is broken so that an electric current cannot flow through the interface device, in particular through the electronic module. If the switch is not actuated, the circuit is closed and the interface device is in an operating state in which it can capture and/or display data.

In an alternative embodiment, the interface device can be activated if the switch is actuated and can be deactivated if the switch is not actuated.

For example, said at least one switch comprises a magnetic switch and the base part comprises a magnet that actuates the magnetic switch if the interface device is fixed in the attachment area of the base part. The switch can thus be actuated by the magnetic field of the magnet, wherein the switch is kept open due to repulsive forces if the interface device is located on the base part. Thus, the interface device is inactive as long as it is located in the attachment area of the base part. However, if the user removes the interface device from the base part, the switch leaves the magnetic field. The switch is then not actuated, wherein the switch is closed in the non-actuated state, so that a current can flow through the interface device.

According to an embodiment, the circuit comprises at least one first switch and at least one second switch as well as at least one first branch and one second branch. The first switch is located in the first branch and closes the first branch when the interface device is detached from the base part. The second switch is located in the circuit in such a way that it can break or close both the first branch and the second branch. As a result of this breaking, the interface device, in particular the electronic module, is deactivated so that it can then be activated anew. In particular, the mating contacts are separated from each other electrically by this breaking.

The circuit is provided in such a way that the interface device, in particular the electronic module, is activated with at least one closed branch. To activate the sensor device, the first switch must therefore be closed and the second switch must close at least one of the two branches so that the mating contacts are connected electrically via at least one branch of the circuit.

The interface device, in particular the holder, can comprise at least one actuating element, wherein the switch, in particular the first switch and/or the second switch, is actuated by actuating the actuating element.

The interface device is thus activatable by actuating the actuating element and/or a new operation of the interface device is triggerable. Thus, a user can execute, for example, several data capture processes by actuating the actuating element without needing to move the interface device back to the attachment area in order to actuate the switch. Thus, a process can be executed particularly efficiently and quickly.

The actuating element is for example a push button.

According to an embodiment, the second switch is allocated to the actuating element, wherein the second switch is designed in such a way that upon actuation of the actuating element, it breaks the first branch and closes the second branch. In particular, the first branch is initially broken upon actuation of the actuating element and the second branch is closed after a delay. The delay ensures that the interface device, in particular the electronic module, is briefly deactivated. However, this delay can be very brief.

To both break the first branch and close the second branch by actuating only one switch, the second switch comprises a first switch element, in particular a NC switch element, in the first branch and a second switch element, in particular a NO switch element, in the second branch.

The second switch is provided in such a way, for example, that initially the first switch element and then the second switch element are actuated upon actuation of actuating the actuating element. As a result, the desired delay between breaking the first branch and closing the second branch is achieved.

The actuating element can be located on a lateral exterior wall of the interface device, in particular the holder. Thus, a user can actuate the actuating element easily when holding the interface device in his hand.

According to the embodiment, the interface device comprises at least a sensor, in particular a barcode scanner, a RFID reader, a touch-sensitive surface and/or at least an output means, in particular a screen, in particular wherein the electronic module comprises said at least one sensor and/or said at least one output means. In this way, the interface system can be used versatilely.

In particular, the holder comprises neither such a sensor—except for the switches and the circuit—nor an output means.

The base part can comprise a fastening means for fastening the base part onto an item of clothing or an object as well as a retraction device, wherein the retraction device is attached to the interface device and is capable of moving the interface device to the fastening means and/or to the attachment area in a predefined holding position, wherein the interface device is fixed detachably without tools in the holding position in the attachment area.

By means of the fastening means, a user can always carry the interface device with him within easy reach without needing to hold the interface device.

The fastening means can also be used for fastening the base part onto the body of a user or onto a moveable object, such as a cart, in particular a shopping cart.

After use, the interface device is moved back into a predefined holding position by means of the retraction device. Thus, a user does not have to move the interface device back into its holding position himself and can apply himself to the next operation immediately after using the interface device. In particular, it suffices if the user releases his hold on the interface device in order to enable the interface device to move back into the holding position by means of the retraction device. This means the retraction device is then active if the interface device is detached from the base part and is not being held.

DESCRIPTION OF THE DRAWINGS

Additional advantages and features of the disclosure can be found in the following description and in the attached drawings to which reference is made. In the drawings:

FIG. 1 shows an exploded view of an interface system according to the disclosure, FIG. 4 shows the base part from FIG. 2 in a perspective view, FIG. 5 shows the base part from FIG. 2 in a side view, FIG. 6 shows the holder from FIG. 3 in a perspective view, FIG. 7 shows an open view of the holder from FIG. 3.

DETAILED DESCRIPTION

Figure 3:
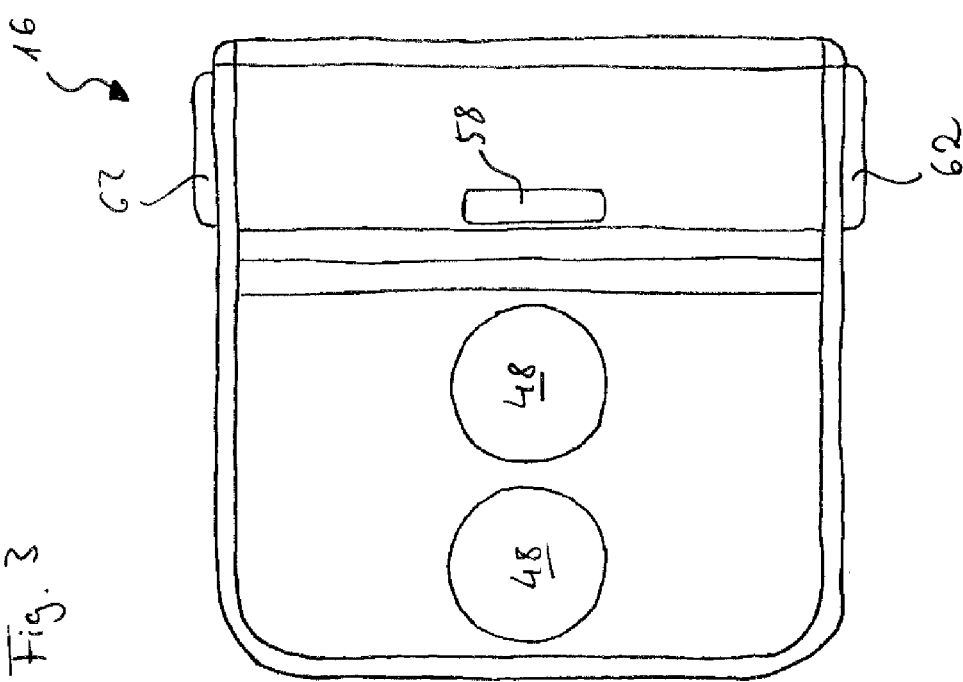
FIG. 3 shows a holder of the interface system according to FIG. 1 in bottom view.

Lists having a plurality of alternatives connected by "and/or", for example "A, B and/or C" are to be understood to disclose an arbitrary combination of the alternatives, i.e. the lists are to be read as "A and/or B and/or C". The same holds true for listings with more than two items.

FIG. 1 shows an interface system 10 in an exploded view. The interface system 10 comprises a base part 12 as well as an interface device 14 that can be fixed detachably without tools onto the base part 12.

The interface device 14 is used for reading or scanning in data in the shown embodiment. After capturing this data, it can be transmitted to a server wirelessly by the interface device 14 and be stored in a database and/or be displayed directly on an output means of the interface device 14, for example on a screen.

For this purpose, the interface device 14 comprises a sensor, such as a barcode scanner, a RFID reader and/or a touch-sensitive surface.

The sensor faces forward, in particular in the case of a barcode scanner, i.e. away from the base part 12. To this end, a corresponding window is provided in the front end face of the interface device 14.

The interface system 10 is portable and can be carried by the user easily. A fastening means 13 is provided in the form of a clip on the base part 12, by means of said clip the base part 12 can be fastened onto an item of user's clothing so that the user can carry the interface system 10 with him without having to constantly hold it in his hand. Instead of a clip, the fastening means 13 can also comprise a clasp, a clamp, an elastic band, a fastening piece that fastens magnetically and/or a hook-and-loop fastener.

FIGS. 4 and 5 show the base part 12 in two additional views, in which the fastening means 13 can be discerned easily.

It is also conceivable that the fastening means 13 is designed for fastening the interface system 19 onto a moveable object, for example a shopping cart.

In the shown embodiment, the interface device 14 is in two parts and comprises a holder 16 as well as an electronic module 18 that can be received in the holder 16. The sensor of the interface device 14 is integrated in particular into the electronic module 18. It is however conceivable that interface device 14 is designed as one piece.

The holder 16 comprises a retainer 20 for receiving the electronic module 18, said retainer 20 enabling the repeated detachment of the electronic module 18 from the holder 16 as well as reinsertion of the electronic module 18 into the holder 16. A detailed view of the holder 16 can be seen in FIG. 6.

In the shown embodiment, the retainer 20 comprises two lateral guides 22, in which the electronic module 18 can be inserted in an insertion direction R, wherein the guides 22 run in the insertion direction R of the electronic module 18.

The guides 22 each consist of a lateral guide wall 24 and a bracket 26 that run from the guide wall 24 towards the opposite guide wall 24. Moreover, the retainer 20 comprises a locking device 28 that holds the electronic module 18 in the retainer 20.

Two mating contacts 32 are provided on a contact surface 30 of the holder 16, against which the electronic module 18 rests in an attached state. The electronic module 18 has two corresponding contact elements 33 on its underside. If the electronic module 18 is located in the holder 16, the contact elements 33 and the mating contacts 32 are electrically contacted in pairs.

The electronic module 18 is activated or triggered if both contact elements 33 are connected electrically.

The base part 12 has an attachment area 34, against which the interface device 14 can rest in a predefined holding position. The predefined holding position is predefined, in particular, in relation to the fastening means 13.

The attachment area 34 is limited by two side walls 38, an end face 38 and a step 40 of the base part 12.

The interface device 14, in particular the holder 16, has a stop 42 that rests against the front end face 38 of the base part 12 when the interface device 14 is in the defined holding position. In addition, an end face 44 of the holder 16 can rest against the step 40 of the base part 12.

Two magnetic components 46 are located in the attachment area 34 of the base part 12, said magnet components 46 comprise for example permanent magnets or a ferromagnetic material. The magnetic components 46 are used to hold the interface device 14 in the defined holding position in the attachment area 34. However, in principle, a magnet component 46 suffices for attaching the interface device 14 to the base part 12.

The holder 16 of the interface device 14 also comprises two magnetic components 48, which are visible in FIG. 3, and are used to attach the interface device 14 to the base part 12 owing to the fact that the magnet components 46 of the base part 12 attract the magnetic components 48. If the base part 12 only comprises one magnetic component 46, one magnetic component 48 also suffices for the holder 16.

Figure 2:
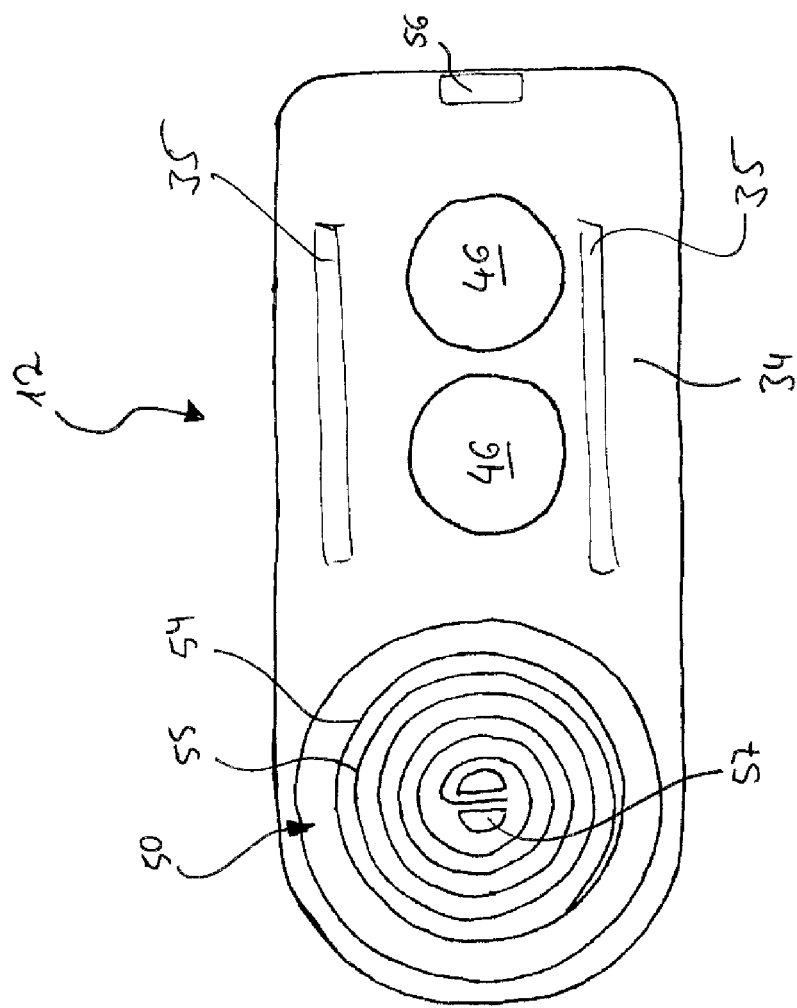
FIG. 2 shows a base part of the interface system according to FIG. 1 in top view.

FIG. 2 shows the base part 12 in top view. As can already been seen in FIG. 1, the two magnetic components 46 are located next to each other. Both magnetic components 48 are also located next to each other, as can be seen in FIG. 3, wherein the magnetic components 46 of the base part 12 and the magnetic components 48 of the holder 16 are located congruently when the interface device 14 is in the holding position.

The magnetic components 46 of the base part 12 and the magnetic components 48 of the interface device 14 are aligned complementarily, which means the magnetic components 46 that lie one on top of the other in the holding position mutually attract each other.

In addition, the two magnetic components 46 of the base part 12 and the magnetic components 46 of the interface device 14 are oppositely aligned. As a result, a defined holding position of the interface device 14 is already determined by the configuration of the magnetic components 46, 48 as only one magnetic component 46 of the base part 12 and one magnetic component 48 of the interface device 14 attract in pairs in each case. The respective other magnetic component 46, 48 of the base part 12 or the interface device 14 is repelled.

The opposing alignment of the magnetic components 46, 48 can also be used to detach the interface device 14 from the base part 12 more easily. To this end, a user can slide the interface device 14 on the base part 12 to a certain extent and in such a way that the repelling magnet components 46, 48 overlap to a certain extent. As a result, the interface device 14 detaches from the base part 12, thereby making the handling of the interface system 10 particularly ergonomic.

In addition, the base part 12 comprises a retraction device 50 that is attached to the interface device 14 in order to simplify the handling of the interface system 10. The retraction device 50 can move the interface device 14 into the predefined holding position if the interface device 14 has been detached previously from the base part 12.

In the shown embodiment, the retraction device 50 comprises a cord 52 that is attached on one free rear end to the interface device 14, in particular to the holder 16, and on the other free end to the rotatable reel 54.

The rotatable reel 54 is acted upon by a spring force caused by the spring 55, for example by a spiral spring that is located in the interior of the reel 54.

In this regard, the spring 55 is attached on one free end to an inner wall of the reel 54 and on the other free end to a pin 57.

If the interface device 14 is removed from the base part 12, then the reel 54 rotates in an unwinding direction and the cord 52 is pulled out, as is shown in FIG. 1.

The spring 55 is tensioned further when the cord 52 is pulled out so that the potential energy stored in the spring 55 increases. If the interface device 14 is detached from the base part 12 and not held by a user, the potential energy stored in the spring 55 is used to move the interface device 14 back into its defined holding position on the base part 12.

To enable the sliding to be defined, there can be a guide 35 for the interface device 14 in the attachment area 34, as is indicated in FIG. 2.

To make the operability of the interface system 10 more simple, it is also provided that the electronic module 18 is automatically put into the operating state if the interface device 14 is detached from the base part 12.

This is ensured by a circuit S of the holder 16 in the shown embodiment.

In FIG. 7, the holder 16 is shown opened so that the circuit S provided in the holder 16 is visible. A corresponding equivalent circuit diagram of the circuit S is shown in FIG. 8.

Figure 8:
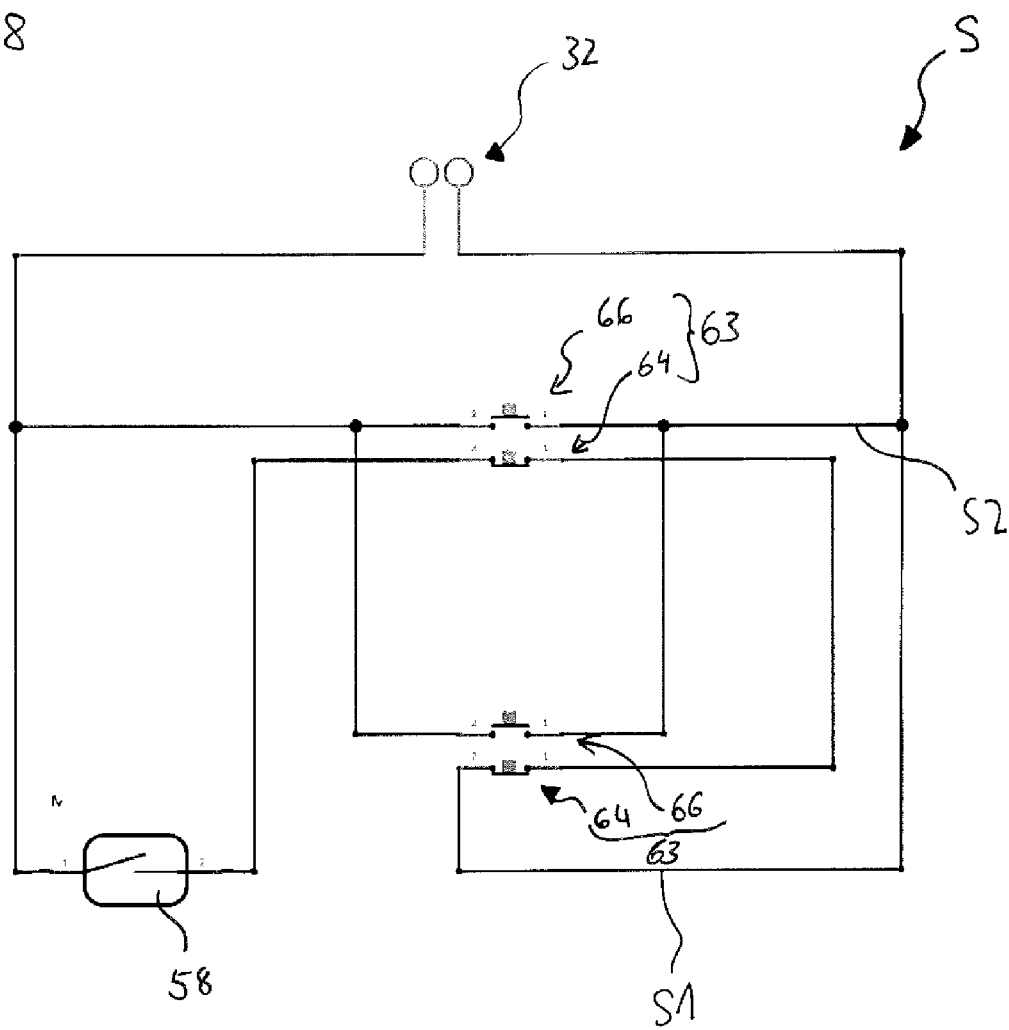
FIG. 8 shows a circuit of the holder illustrated in FIG. 7.

FIG. 8 shows a state in which the interface device 14 is located on the base part 12 and the switch 58 is actuated, in particular is open, so that the interface device 14, in particular the electronic module 18, is inactive.

The circuit S comprises a first branch S1 and a second branch S2 as well as a first switch 58 and here two second switches 63.

An electrical connection can be established between both mating contacts 32 both via the first branch S1 and via the second branch S2, thus activating the electronic module 18. Thus, the branches S1, S2 run in parallel.

The first switch 58 is provided in the first branch S1 and can open or (partially) close this branch S1. In the shown embodiment, the first switch 58 is a magnetic switch.

Both second switches 63 each have a first switch element 64 and a second switch element 66, wherein in each case the first switch element 64 is located in the first branch S1 of the circuit S and the second switch element 66 in the second branch S2 of the circuit S. The switch elements 64, 66 can open or (partially) close their respective branch S1, S2.

The first switch elements 64 are connected in series in the first branch S1, in particular in series with the first switch 58.

The second switch elements 66 are connected in parallel in the second branch S2.

In the shown embodiment, the first switch element 64 is a NC switch element in each case, which means a switch element that is closed without being acted upon by an external force.

In the shown embodiment, the second switch element 66 is a NO switch element in each case, which means a switch element that is open without being acted upon by an external force.

As shown in FIG. 7, both switch elements 64, 66 can be configured as separate switch elements that combined together form the switch 63. It is however conceivable that the switch 63 is designed as a component with two switching points that constitute the switch elements 64, 66.

The switch 63 and thus the switch elements 64, 66 can be actuated mechanically by means of an actuating element 62, as is evident in FIG. 7.

To automatically activate the interface device 14, in particular the electronic module 18, when it removed from the base part 12, a magnet 56 (FIG. 2) is located on the base part 12 in such a way that it actuates the first switch 58 when the interface device 14 is in the holding position. Alternatively, it is also conceivable that the first switch 58 can be shifted mechanically by a corresponding element on the base part 12.

If the interface device 14 is on the base part 12 in the defined holding position, the switch 58 is kept open by means of the magnet 56. If the interface device 14 is detached from the base part 12, the first switch 58 closes as a result of the cessation of the magnetic repulsive forces of the magnet 56.

The first branch S1 of the circuit S is thus closed, thereby activating the electronic module 18—provided that the actuating elements 62 are not actuated. A user can thus execute a relevant operation, for example a data capture process with the scanner, immediately after detaching the interface device 14 from the base part 12.

When the operation is completed, the interface device 14 can be moved back into its holding position on the base part 12 by means of the retraction device 50, thereby opening the switch 58 once again and causing the electronic module 18 to be put into a deactivated state.

It is however also conceivable that a user would like to implement several operations successively. In this case, it would be impractical if the interface device 14 would have to be repeatedly moved into the holding position and detached once again in order to start a new operation.

Therefore, the actuating elements 62 are each located on the lateral external walls 60 of the holder 16 on both sides. The actuating elements 62 are for example push buttons.

If the actuating elements 62 are pushed by a user, the first switch element 64 is initially actuated and shortly after the second switch element 66 of the respective switch 63.

By viewing FIG. 8, it becomes clear that the first branch S1 of the circuit S is broken by actuating one of the switches 63 initially by means of the corresponding first switch element 64.

As a result, the mating contacts 32 are disconnected electrically, thereby briefly deactivating the interface device 14, in particular the electronic module 18.

This state is however only brief as the second switch element 66 is actuated after actuating the first switch element 64 so that the second branch S2 of the circuit S is closed, thereby in turn connecting the mating contacts 32 and thus the contact elements 33 electrically. The electronic module 18 is thus activated.

Therefore, it suffices if the user actuates only one of the two actuating elements 62 in order to start a new data capture process. Taking ergonomics into consideration, it is however more comfortable for a user to push both actuating elements 62 simultaneously. Moreover, in this way, the interface system 10 is easily operable for left-handed and right-handed people equally.

In an alternative embodiment, only a second switch 63 is provided for example.

The invention claimed is:

1. A portable interface system comprising an interface device and a portable base part, wherein the interface device is fixable detachably without tools in an attachment area of the base part and wherein the interface system is designed in such a way that the interface device is activated if the interface device is detached from the base part, wherein the interface device comprises an electronic module and a holder, wherein the holder comprises a retainer that is provided for receiving the electronic module and for attaching the electronic module repeatably without using tools,
   wherein the interface device comprises a circuit for activating the interface device with at least one magnetic switch, and the base part comprises a magnet that actuates the magnetic switch if the interface device is fixed in the attachment area of the base part, wherein the magnetic switch activates the interface device when the interface device is detached from the base part.

2. The portable interface system according to claim 1, wherein the interface device is a sensor device.

3. The portable interface system according to claim 1, wherein the holder comprises at least one mating contact and that the electronic module comprises at least one contact element, wherein said at least one mating contact and said at least one contact element are electrically contacted if the electronic module is inserted into the retainer of the holder.

4. The portable interface system according to claim 1, wherein said at least one magnetic switch is not actuated if the interface device is detached from the base part.

5. The portable interface system according to claim 1, wherein the circuit comprises the at least one magnetic switch and at least one second switch and comprises at least one first branch and one second branch, wherein the magnetic switch is located in the first branch and closes the first branch if the interface device is detached from the base part, and wherein the second switch is located in the circuit in such a way that it can break or close both the first branch and the second branch.

6. The portable interface system according to claim 5, wherein the second switch comprises a first switch element in the first branch and a second switch element in the second branch.

7. The portable interface system according to claim 6, wherein at least one of the first switch element is a NC switch element and the second switch element is a NO switch element.

8. The portable interface system according to claim 7, wherein second switch is provided in such a way that initially the first switch element and then the second switch element are actuated upon actuation of the actuating element.

9. The portable interface system according to claim 5, wherein an actuating element is located on a lateral exterior wall of the interface device.

10. The portable interface system according to claim 1, wherein the interface device comprises at least one actuating element, wherein the magnetic switch is actuated by actuating the actuating element.

11. The portable interface system according to claim 10, wherein the holder comprises the at least one actuating element.

12. The portable interface system according to claim 10, wherein at least one of the magnetic switch and a second switch is actuated by actuating the actuating element.

13. The portable interface system according to claim 10, wherein a second switch is allocated to the actuating element, wherein the second switch is designed in such a way that it breaks a first branch of the circuit and closes a second branch of the circuit upon actuation of the actuating element.

14. The portable interface system according to claim 1, wherein the electronic module comprises at least one of at least one sensor and at least one output means.

15. The portable interface system according to claim 1, wherein the electronic module comprises at least one of a barcode scanner, a RFID reader, a touch-sensitive surface and a screen.

16. The portable interface system according to claim 1, wherein the base part comprises a fastening means for fastening the base part onto an item of clothing as well as a retraction device, wherein the retraction device is attached to the interface device and is capable of moving the interface device to the fastening means in the attachment area in a predefined holding position, wherein the interface device is fixed detachably without tools in the holding position in the attachment area.

17. A portable interface system comprising an interface device and a portable base part, wherein the interface device is fixable detachably without tools in an attachment area of the base part, wherein the interface device comprises an electronic module and a holder, wherein the holder comprises a retainer that is provided for receiving the electronic module, and wherein the base part comprises a fastening means for fastening the base part onto an item of clothing as well as a retraction device, wherein the retraction device includes a cord attached to the base part and the interface device, and spring, and is capable of retracting the interface device using a spring force caused by the spring.

18. The portable interface system according to claim 17, wherein the holder comprises at least one actuating element and the electronic module is activatable by actuating the actuating element.

19. The portable interface system according to claim 17, wherein the interface device comprises a circuit for activating the interface device with at least one magnetic switch and the base part comprises a magnet that actuates the magnetic switch if the interface device is fixed in the attachment area of the base part, wherein the magnetic switch activates the interface device when the interface device is detached from the base part.

* * * * *